US009117436B2

(12) United States Patent
Kobayashi et al.

(10) Patent No.: US 9,117,436 B2
(45) Date of Patent: Aug. 25, 2015

(54) SOUND PROCESSING APPARATUS AND SOUND PROCESSING METHOD

(75) Inventors: Eiko Kobayashi, Hamamatsu (JP); Toshiaki Ishibashi, Hamamatsu (JP)

(73) Assignee: YAMAHA CORPORATION (JP)

( * ) Notice: Subject to any disclaimer, the term of this patent is extended or adjusted under 35 U.S.C. 154(b) by 248 days.

(21) Appl. No.: 13/822,490

(22) PCT Filed: Oct. 21, 2011

(86) PCT No.: PCT/JP2011/074255
§ 371 (c)(1),
(2), (4) Date: Mar. 12, 2013

(87) PCT Pub. No.: WO2012/053629
PCT Pub. Date: Apr. 26, 2012

(65) Prior Publication Data
US 2013/0182866 A1 Jul. 18, 2013

(30) Foreign Application Priority Data
Oct. 21, 2010 (JP) ................................ 2010-236019

(51) Int. Cl.
*H04R 3/02* (2006.01)
*H04R 29/00* (2006.01)
*H03G 3/20* (2006.01)
*G10K 11/175* (2006.01)
*H04K 1/02* (2006.01)
(Continued)

(52) U.S. Cl.
CPC ............... *G10K 11/175* (2013.01); *G10L 25/15* (2013.01); *G10L 25/90* (2013.01); *H04K 1/02* (2013.01); *H04R 3/02* (2013.01)

(58) Field of Classification Search
CPC ........... G10K 11/175; G10K 2210/51; G10K 11/178; H04K 1/02
USPC ............................................ 381/73.1, 56, 57
See application file for complete search history.

(56) References Cited

U.S. PATENT DOCUMENTS

2003/0002687 A1 1/2003 Raptopoulos et al.
2003/0026436 A1 * 2/2003 Raptopoulos et al. ....... 381/71.4
(Continued)

FOREIGN PATENT DOCUMENTS

JP 2004-510191 A 4/2004
JP 2008-233670 A 10/2008
JP 2009-118062 A 5/2009

OTHER PUBLICATIONS

Chinese Office Action dated Jun. 4, 2014 issued in corresponding Chinese Application No. CN201180044816.9. English translation provided.
(Continued)

*Primary Examiner* — Vivian Chin
*Assistant Examiner* — Douglas Suthers
(74) *Attorney, Agent, or Firm* — Rossi, Kimms & McDowell LLP

(57) ABSTRACT

A sound processing apparatus includes an inputting section that inputs a sound signal, an analyzing section that analyzes the input sound signal, a storing section that stores a general-purpose masking sound, a masking sound producing section that, based on a result of the analysis by the analyzing section, processes the general-purpose masking sound stored in the storing section to produce an output masking sound, and an outputting section that outputs the output masking sound.

8 Claims, 4 Drawing Sheets

(51) Int. Cl.
*G10L 25/90* (2013.01)
*G10L 25/15* (2013.01)

(56) References Cited

U.S. PATENT DOCUMENTS

| | | | | |
|---|---|---|---|---|
| 2005/0254663 | A1* | 11/2005 | Raptopoulos et al. | 381/71.1 |
| 2007/0203698 | A1 | 8/2007 | Mapes-Riordan et al. | |

OTHER PUBLICATIONS

Japanese Office Action for corresponding JP2010-236019, mail date May 20, 2014. References cited in NPL cited in earlier IDS. English translation provided.
ISR issued Nov. 22, 2011 for PCT/JP2011/074255 (English Translation provided).

* cited by examiner (A)

FIG. 5

(A)

| | | |
|---|---|---|
| DISTURBANCE SOUND A | BACKGROUND SOUND A | DRAMATIC SOUND A |
| DISTURBANCE SOUND B | BACKGROUND SOUND B | DRAMATIC SOUND B |
| ⋮ | | |
| DISTURBANCE SOUND N | BACKGROUND SOUND N | DRAMATIC SOUND N |

(B)

| | | |
|---|---|---|
| DISTURBANCE SOUND A | BACKGROUND SOUND A | DRAMATIC SOUND A |
| | BACKGROUND SOUND A | DRAMATIC SOUND B |
| | BACKGROUND SOUND B | DRAMATIC SOUND B |
| DISTURBANCE SOUND B | BACKGROUND SOUND B | DRAMATIC SOUND B |
| | BACKGROUND SOUND C | DRAMATIC SOUND C |
| ⋮ | | |
| DISTURBANCE SOUND N | BACKGROUND SOUND N | DRAMATIC SOUND N |

(C)

| | | | | | |
|---|---|---|---|---|---|
| DISTURBANCE SOUND A | 100 | BACKGROUND SOUND A | 50 | DRAMATIC SOUND A | 10 |
| | | BACKGROUND SOUND A | 50 | DRAMATIC SOUND B | 5 |
| | | BACKGROUND SOUND B | 30 | DRAMATIC SOUND B | 0 |
| DISTURBANCE SOUND B | 100 | BACKGROUND SOUND B | 50 | DRAMATIC SOUND B | 10 |
| | | BACKGROUND SOUND C | 20 | DRAMATIC SOUND C | 10 |
| ⋮ | | | | | |
| DISTURBANCE SOUND N | 100 | BACKGROUND SOUND N | 15 | DRAMATIC SOUND N | 5 |

SOUND PROCESSING APPARATUS AND SOUND PROCESSING METHOD

TECHNICAL FIELD

The present invention relates to a sound processing apparatus and sound processing method in which a sound that is generated in the surrounding area is picked up, and an output sound is changed based on the picked-up sound.

BACKGROUND ART

Conventionally, a configuration has been proposed where a sound that is generated in the surrounding area is picked up and processed, the picked-up sound and the processed sound are mixed together, and the mixed sound is output from a loudspeaker, thereby causing the listener to hear a sound which is different from the sound that is generated in the surrounding area (for example, see Patent Document 1). According to the configuration, the sound (for example, the voice of the speaker) that is generated in the surrounding area is made difficult to be heard, and it is possible to mask the voice of the speaker.

PRIOR ART REFERENCE

Patent Document

Patent Document 1: JP-A-2009-118062

SUMMARY OF THE INVENTION

Problems to be Solved by the Invention

When a sound output from a loudspeaker is again picked up by a microphone, however, there is a possibility that a certain frequency component of the picked-up sound may be amplified and then output, and there is a fear that howling may occur. When a sound which is different from the voice of the speaker is picked up, moreover, there is a case where a masking sound which will adequately mask the objective voice of the speaker cannot be output.

Therefore, it is an object of the invention to provide a sound processing apparatus and sound processing method which produce an adequate masking sound while preventing howling from occurring.

Means for Solving the Problems

The sound processing apparatus provided by the invention is a sound processing apparatus comprising:

an inputting section that inputs a sound signal;

an analyzing section that analyzes the input sound signal;

a storing section that stores a general-purpose masking sound;

a masking sound producing section that, based on a result of the analysis by the analyzing section, processes the general-purpose masking sound stored in the storing section to produce an output masking sound; and an outputting section that outputs the output masking sound.

Preferably, the analyzing section extracts a sound feature amount of the input sound signal, and the masking sound producing section processes the general-purpose masking sound stored in the storing section, based on the sound feature amount, thereby producing the output masking sound.

Preferably, the apparatus further includes an eliminating section that eliminates the output masking sound from the input sound signal.

Preferably, the apparatus further includes an analysis result storing section that stores the analysis result for a predetermined time period, and the masking sound producing section compares the result of the analysis by the analyzing section with the analysis result stored in the analysis result storing section, and if a different analysis result is calculated, stops the production of the output masking sound which is based on the result of the analysis by the analyzing section.

Preferably, the output masking sound is configured by a combination of a sound which is continuously generated, and a sound which is intermittently generated.

The sound processing method in a sound processing apparatus having a storing section which stores a general-purpose masking sound, and provided by the invention is a sound processing method including:

an inputting step of inputting a sound signal;

an analyzing step of analyzing the input sound signal;

a masking sound producing step of, based on a result of the analysis by the analyzing step, processing the general-purpose masking sound stored in the storing section to produce an output masking sound; and an outputting step of outputting the output masking sound.

Preferably, in the analyzing step, a sound feature amount of the input sound signal is extracted, and, in the masking sound producing step, the general-purpose masking sound stored in the storing section is processed based on the sound feature amount, thereby producing the output masking sound.

Preferably, the method further includes an eliminating step of eliminating the output masking sound from the input sound signal.

Preferably, the sound processing apparatus further includes an analysis result storing section which stores the analysis result for a predetermined time period, and, in the sound processing method, in the masking sound producing step, the result of the analysis in the analyzing step is compared with the analysis result stored in the analysis result storing section, and, if a different analysis result is calculated, the production of the output masking sound which is based on the result of the analysis in the analyzing step is stopped.

Preferably, the output masking sound is configured by a combination of a sound which is continuously generated, and a sound which is intermittently generated.

Advantageous Effects of the Invention

According to the invention, an adequate masking sound can be produced while preventing howling from occurring.

BRIEF DESCRIPTION OF THE DRAWINGS

FIGS. 5(A) to 5(C) are views showing a correspondence table of a disturbance sound, a background sound, and a dramatic sound.

MODE FOR CARRYING OUT THE INVENTION

Figure 1:
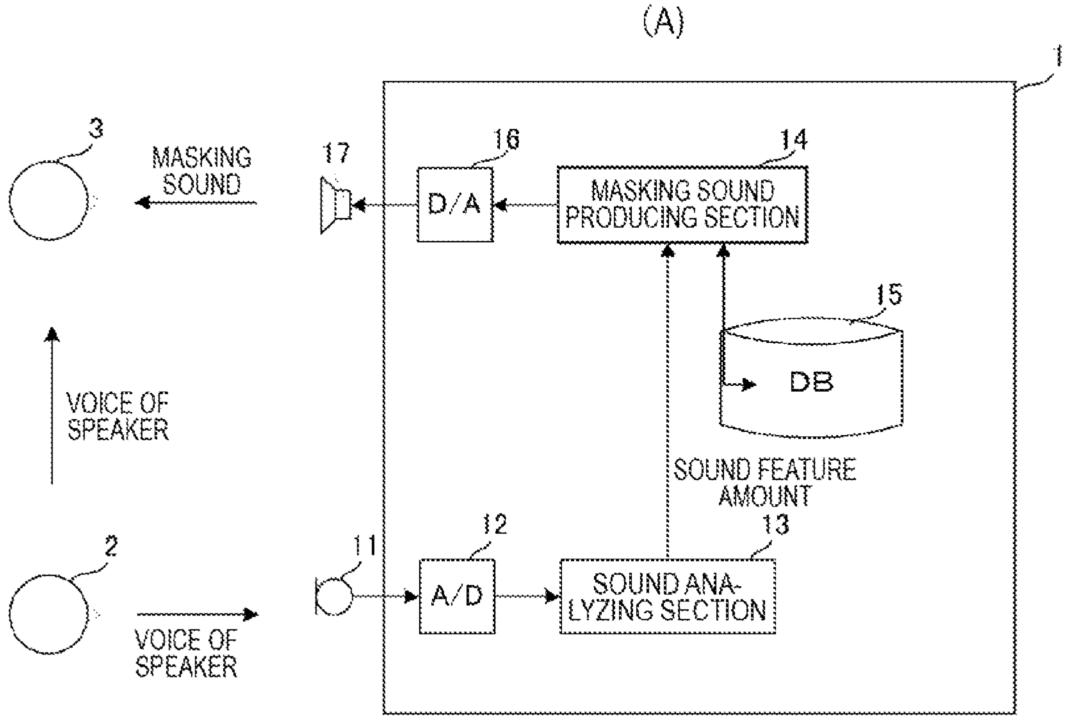
FIGS. 1(A) and 1(B) are block diagrams showing the configuration of a sound masking system.
Figure 1:
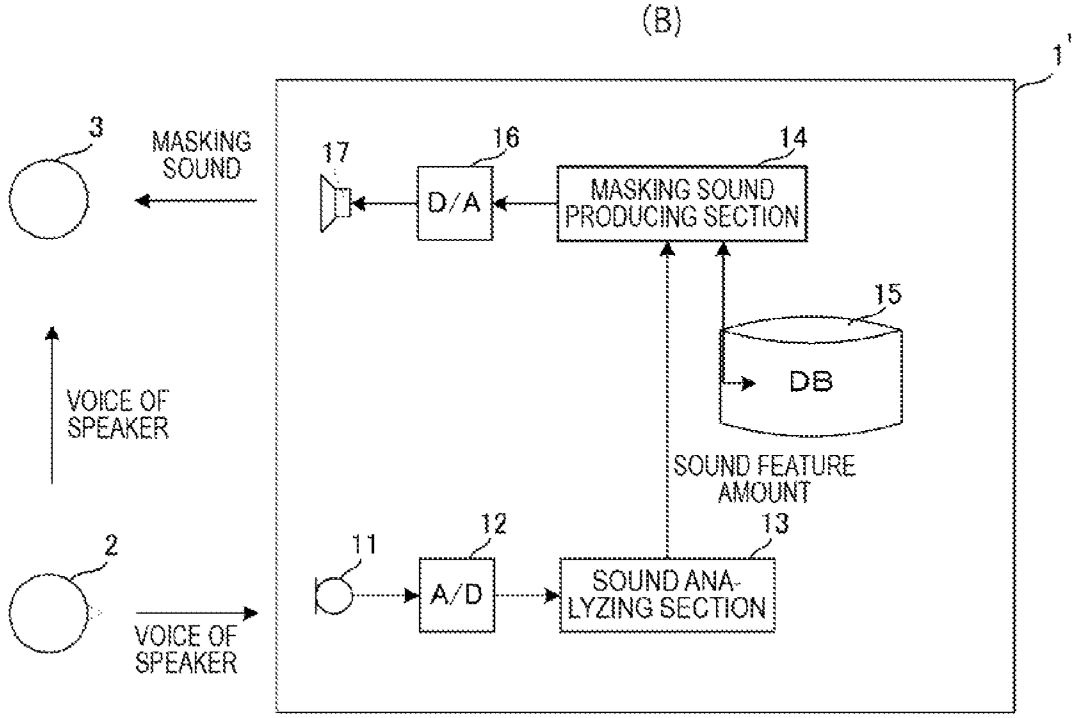

FIG. 1(A) is a block diagrams showing the configuration of a sound masking system including the sound processing apparatus of the invention. The sound masking system includes the sound processing apparatus 1, a microphone 11 which picks up the voice of a speaker 2 and a surrounding sound, and a loudspeaker 17 which emits a masking sound to a listener 3. The sound processing apparatus 1 picks up the voice of the speaker 2 through the microphone 11, and emits the masking sound which masks the voice of the speaker 2, to the listener 3 through the loudspeaker 17.

In FIG. 1(A), the sound processing apparatus 1 includes an A/D converting section 12, a sound analyzing section 13, a masking sound producing section 14, a database 15, and a D/A converting section 16. Alternatively, a configuration may be employed where, as in a sound processing apparatus 1' shown in FIG. 1(B), the microphone 11 and the loudspeaker 17 are integrated with the sound processing apparatus 1 of FIG. 1(A). Alternatively, only one of the microphone 11 and the loudspeaker 17 may be integrated with the sound processing apparatus 1 of FIG. 1(A).

The microphone 11 picks up a sound which is generated around the apparatus (in the example, mainly voice uttered by the speaker 2). The picked-up sound is converted to a digital sound signal by the A/D converting section 12, and then supplied to the sound analyzing section 13. The sampling rate Fs of the A/D converting section 12 is sufficiently set to a frequency (for example, Fs=20 kHz) corresponding to a band (for example, 10 kHz or lower) in which the main components of the human voice exist.

The sound analyzing section 13 analyses the input sound signal, and extracts the sound feature amount. The sound feature amount is a physical parameter which functions as an index for identifying the speaker, and configured by, for example, the formants, and the pitch. The formants indicate a plurality of peaks in the sound frequency spectrum, and is a physical parameter which affects the voice quality. The pitch is a physical parameter which indicates the sound pitch (fundamental frequency). In the case where the listener listens to two sounds or voices, when the two sounds or voices approximate each other in voice quality and sound pitch, it is difficult to distinguish the two sounds or voices from each other. When a sound (sound having no lexical meaning) which approximates the voice of the speaker 2, and which has a different content is output as a disturbance sound from the loudspeaker 17 while being contained in the masking sound, therefore, the listener 3 hardly understands the content of the utterance of the speaker 2, and a high masking effect can be expected.

Figure 2:
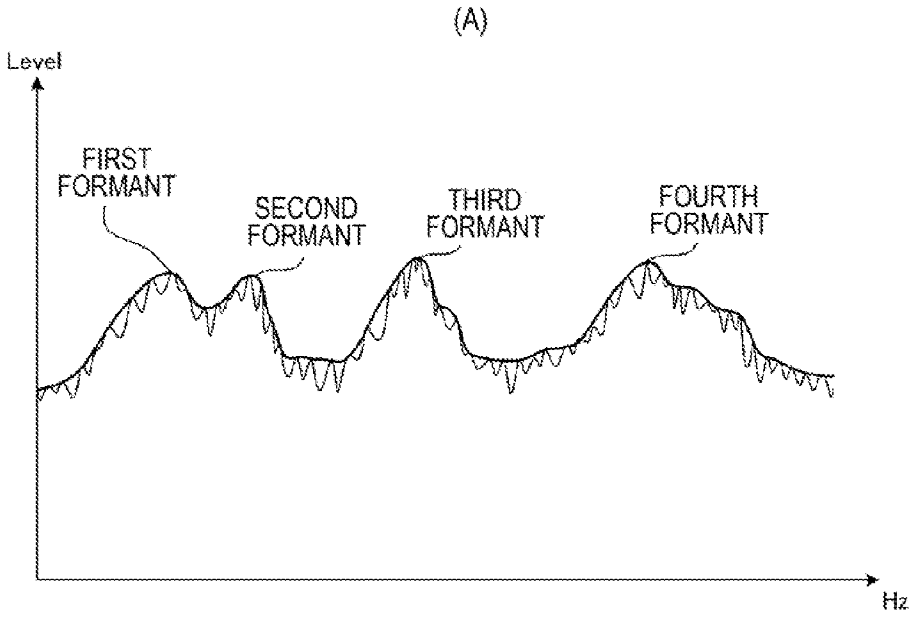
FIG. 2(A) is a view showing frequency characteristics of a sound signal.
FIG. 2(B) is a view showing a process of shifting formants of a disturbance sound, that of changing a level, and that of changing a band width.
Figure 2:
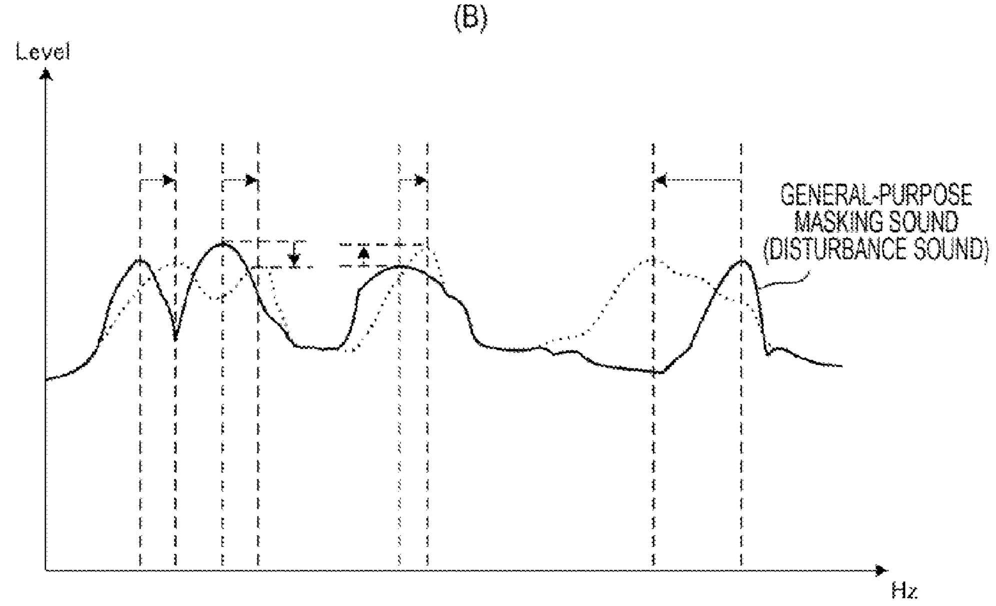

Therefore, the sound analyzing section 13 first calculates the pitch from the input sound signal. For example, the pitch is calculated from the zero-cross point (the point where the amplitude is 0) on the time axis. Moreover, the sound analyzing section 13 performs a frequency analysis (for example, an FFT: Fast Fourier Transform) on the input sound signal to calculate the frequency spectrum. Then, the sound analyzing section 13 detects a frequency peak from the frequency spectrum. A frequency peak is a frequency component which is higher in level than the previous and subsequent frequency components. A plurality of frequency peaks are detected. As shown in FIG. 2(A), however, the human voice contains a large number of extremely minute frequency peaks, and hence only frequency peaks of the envelope components are extracted. The frequency peaks constitute formants. As a parameter indicating each formant, the center frequency, the level, the bandwidth (half bandwidth), and the like are extracted. As the sound feature amount, another physical parameter such as the inclination of the spectrum may be extracted.

The sound analyzing section 13 outputs the thus extracted sound feature amount to the masking sound producing section 14.

The masking sound producing section 14 produces an output masking sound based on the input sound feature amount, and sound source data (general-purpose masking sound) stored in the database 15. Specifically, the section performs the following processes.

First, the masking sound producing section 14 reads out the sound data of the general-purpose masking sound from the database 15. The general-purpose masking sound is a general-purpose one which can be expected to exert a masking effect on any kind of speaker at a certain degree. For example, the general-purpose masking sound is configured by sound data in which voices of a plurality of persons including men and women are recorded, and contains a disturbance sound having no lexical meaning (the content of a conversation cannot be understood). As described later, the general-purpose masking sound may contain a background sound (such as a murmur of a brook) and a dramatic sound (such as a bird song) for relaxing uncomfortable feeling of the listener, in addition to the disturbance sound. As the sound data of the general-purpose masking sound, sound signals on the frequency axis (or sound signals on the time axis) such as the disturbance sound, the background sound, and the dramatic sound are stored in the database 15.

The masking sound producing section 14 processes sound data relating to the disturbance sound in the read out general-purpose masking sound, based on the sound feature amount supplied from the sound analyzing section 13. For example, the pitch of the read out disturbance sound is converted to that of the input sound signal. In this case, the frequency shifting is performed so that the fundamental frequency component of the disturbance sound coincides with that of the input sound signal.

As shown in FIG. 2(B), moreover, the formant components of the disturbance sound are made coincident with those of the input sound signal. In (B) of the figure, for example, the first formant, second formant, and third formant of the disturbance sound signal are lower in center frequency than those of the input sound signal, respectively. Therefore, a process of shifting toward the higher frequency side is performed. Moreover, the second formant has a level which is higher than the level of the input sound signal, and hence a process of lowering the level is performed. Furthermore, the third formant has a level which is lower than the level of the input sound signal, and hence a process of raising the level is performed, and, since the bandwidth is wider than the level of the input sound signal, also a process of narrowing the bandwidth is performed. With respect to the fourth formant, a process of shifting toward the lower frequency side is performed, and also a process of widening the bandwidth is performed. In the example of the figure, the processes of processing the first to fourth formants have been described. However, the order numbers of formants to be processed are not limited to those of the example. For example, formants of higher order numbers may be processed.

In the case where other physical parameters such as the inclination of the spectrum are included in the sound feature amount, the sound data of the disturbance sound are further processed based on these parameters.

The masking sound producing section 14 processes the disturbance sound as described above, thereby producing the output masking sound. The produced output masking sound is converted by the D/A converting section 16 to an analog sound signal, and emitted from the loudspeaker 17 to be heard by the listener 3.

The masking sound which is emitted from the loudspeaker 17 in this way has no lexical meaning, and contains the disturbance sound which approximates the voice of the speaker 2 in voice quality and sound pitch. Therefore, the listener 3 hears, together with the voice of the speaker 2, the sound which has a similar voice quality and sound pitch, and in which the meaning cannot be understood, so that the content of the actual utterance of the speaker 2 is hardly extracted and understood.

In such a disturbance sound, moreover, the voice quality and the sound pitch approximate those of the voice of the speaker 2. Even in the case of a low sound volume, therefore, a high masking effect is exerted, and it is possible to reduce an uncomfortable feeling which may be caused by a situation where the listener 3 hears the masking sound. When, as described above, sound data of a background sound (such as a murmur of a brook) and a dramatic sound (such as a bird song) are previously stored in the database 15 and output while being contained in the output masking sound, the uncomfortable feeling can be further reduced.

Furthermore, the masking sound is a sound which is newly produced based on the input sound signal, and not a sound which is obtained by amplifying the input sound signal and then output. Therefore, a loop system in which a sound emitted from the loudspeaker is input to the microphone, and then again emitted is not formed, and there is no possibility that howling may occur. In the sound masking system shown in the embodiment, consequently, it is not required to consider the placement relationship of the microphone and the loudspeaker, and the masking sound can be stably output in any installation environment.

The sound feature amount which is extracted in the sound analyzing section 13, such as formants is a physical parameter which is specific to voice uttered by a human being, and hence scarcely extracted from a sound other than voice uttered by a human being. Therefore, there is less fear that the masking sound is changed by an environmental sound (for example, noises of an air conditioner) which is generated around the apparatus, and an adequate masking sound can be stably produced.

Although, in the embodiment, the example in which one kind of disturbance sound is stored in the database 15 has been described, plural kinds of disturbance sounds having different formants and pitches may be stored in the database 15. In this case, a disturbance sound which is closest to the sound feature amount of the input sound signal is read out and processed (or not processed) to produce the output masking sound, so that the calculation amount can be suppressed.

Although the embodiment has been described as the example in which the disturbance sound is always output, furthermore, it is not necessary to always output the disturbance sound. In a state where the speaker 2 does not utter a voice, for example, it is not required to output the disturbance sound. When the sound feature amount cannot be extracted in the sound analyzing section 13, therefore, the output of the disturbance sound may be stopped.

The masking sound may be configured by a combination of a sound which is continuously generated, and that which is intermittently generated. In a state where the speaker 2 does not utter a voice, when the sound feature amount cannot be extracted in the sound analyzing section 13, for example, the disturbance sound stored in the database 15 is output as it is as the output masking sound, and, when the speaker 2 utters a voice and the sound feature amount can be extracted in the sound analyzing section 13, an output masking sound which is obtained by processing the disturbance sound is output. According to the configuration, it is possible to prevent a state where the listener 3 becomes accustomed to the masking sound and distinguishes the actual voice of the speaker 2 (the so-called cocktail party effect), from occurring.

As a sound which is continuously generated, the disturbance sound and a background sound such as a murmur of a brook may be used, and, as a sound which is intermittently generated, a dramatic sound such as a bird song may be used. For example, the disturbance sound and the background sound may be continuously output, and the dramatic sound may be intermittently output at predetermined timings. At this time, with respect to the background sound, recorded sound data (data which are obtained by recording an actual murmur of a brook, or the like) for a predetermined time period are repeatedly reproduced, and, with respect to the dramatic sound, recorded sound data (data which are obtained by recording an actual bird song, or the like) for a predetermined time period are reproduced randomly or at intervals of a predetermined sound time period (for example, in conforming to the repetition timing of the environmental sound). Also in this case, the sound which is heard by the listener 3 is not always the same, and hence it is possible to prevent the cocktail party effect from occurring. With respect to the combination of a sound which is continuously generated and that which is intermittently generated, the following application examples are possible.

FIG. 5 is a view showing correspondence tables of the disturbance sound, the background sound, and the dramatic sound. The tables are stored in the database 15, and read out by the masking sound producing section 14. In the examples of the figure, description will be made assuming that plural kinds of disturbance sounds having different formants and pitches are stored in the database 15.

As shown in FIG. 5(A), combinations of disturbance sounds, background sounds, and dramatic sounds stored in the database 15 are described in the correspondence table. For example, a disturbance sound A is made correspondent with a background sound A (for example, a murmur of a brook) and a dramatic sound A (for example, a bird song). Preferably, the disturbance sounds are made correspondent with a background sound and dramatic sound which exert a high masking effect.

In this case, the masking sound producing section 14 reads out a disturbance sound (for example, the disturbance sound A) which is closest to the sound feature amount of the input sound signal, and refers the table to select and read out the background sound (for example, the background sound A) and dramatic sound (for example, the dramatic sound A) which are made correspondent. As a result, the disturbance sound and background sound which are adequate to the input sound signal are continuously reproduced, and the dramatic sound is intermittently reproduced.

As shown in FIG. 5(B), moreover, a background sound and dramatic sound which are corresponded to each disturbance sound are not limited in number to one. As shown in FIG. 5(B), with respect to the disturbance sound A, for example, the correspondence table shows a combination of the background sound A and a dramatic sound B, and that of a background sound B and the dramatic sound B, in addition to that of the background sound A and the dramatic sound A. With respect to a disturbance sound B, the correspondence table shows a combination of a background sound C and a dramatic sound C, in addition to that of the background sound B and the dramatic sound B.

In this case, an interface for user operation may be disposed in the sound processing apparatus 1, and the masking sound producing section 14 may receive a manual selection from the user, and may select and read out the received combination of a background sound and a dramatic sound. Alternatively, automatic selection may be performed in accordance with the time zone, the season, the location, and the like. For example, there are a case where, in the morning, the background sound A and the dramatic sound A (a murmur of a brook+a bird song) are selected, that where, in the noon during summer, the background sound A and the dramatic sound B (a murmur of a brook+droning of cicadas) are selected, and that where, in a location near the sea, the background sound B (ripple sound and the like) is selected. In such a case, the sound change is further diversified, and therefore the cocktail party effect can be prevented more adequately from occurring.

As shown in FIG. 5(C), moreover, the table shows also volume ratios of the sounds. The values of the volume ratios shown in FIG. 5(C) indicate relative values, and do not indicate actual volume values (dB).

With relative to the volume of 100 of the disturbance sound A, for example, the volume ratios in which the volume of the background sound A is 50, and that of the dramatic sound A is 10 are shown. Therefore, the masking sound producing section 14 outputs a masking sound in which the volume of the background sound A is about a half of that of the disturbance sound A, and that of the dramatic sound A is about 1/10 of that of the disturbance sound A. As in the combination of the disturbance sound A, the background sound B, and the dramatic sound B shown in FIG. 5(C), a mode in which the volume of the dramatic sound is 0 so that the dramatic sound is not output may be possible. As described above, also the volume can be changed in addition to the mode where the background sound and the dramatic sound are changed in accordance with the input sound signal.

In the case where an interface for user operation is disposed in the sound processing apparatus 1 as described above, designations of the content of the combination and the volume ratio may be received from the user, and the description content of the table may be allowed to be changed.

Furthermore, the sound processing apparatus of the embodiment may be configured as the following modifications.

Figure 3:
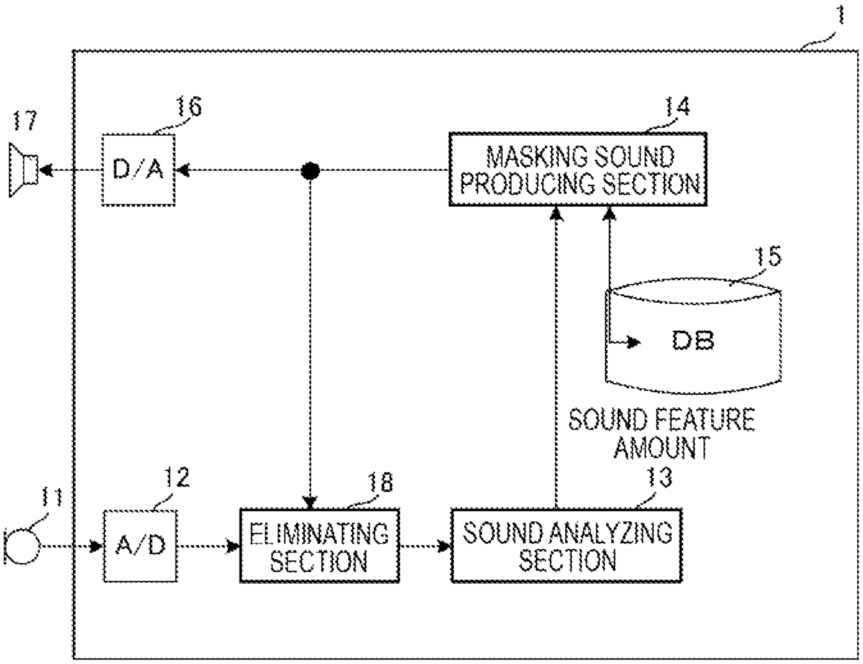
FIG. 3 is a block diagram showing the configuration of a sound processing apparatus of Modification 1.

FIG. 3 is a block diagram showing the configuration of a sound processing apparatus of Modification 1. In FIG. 3, the components which are identical with those of the sound processing apparatus 1 shown in FIG. 1(A) are denoted by the same reference numerals, and their description is omitted.

The sound processing apparatus 1 of Modification 1 shown in FIG. 3 includes an eliminating section 18 in addition to components which are similar to those of the sound processing apparatus 1 shown in FIG. 1(A). Similarly with the sound processing apparatus 1' shown in FIG. 1(B), the microphone 11 and the loudspeaker 17 may be integrated with the sound processing apparatus 1 of FIG. 3. Alternatively, only one of the microphone 11 and the loudspeaker 17 may be integrated with the sound processing apparatus 1 of FIG. 3.

The eliminating section 18 is a so-called echo canceller, and performs a process of eliminating the echo component of the sound signal (signal after the A/D conversion) supplied from the microphone 11. According to the configuration, only a sound (voice of the speaker) which is generated around the apparatus is supplied to the sound analyzing section 13, and the accuracy of extraction of the sound feature amount can be improved.

The echo cancellation in the eliminating section 18 may be performed in any manner. For example, the output masking sound is filter-processed by using an adaptive filter in which the transmission characteristics of the acoustic transmission system extending from the loudspeaker 17 to the microphone 11 are simulated, and the echo component is eliminated by performing a subtracting process on the signal supplied from the microphone 11.

In the embodiment, however, a system in which the input sound signal is looped and input to a microphone does not exist as described above, and therefore the sound analyzing section 13 can extract the sound feature amount while simply removing (ignoring) components of the output masking sound. In this case, the adaptive filter is not necessary.

Figure 4:
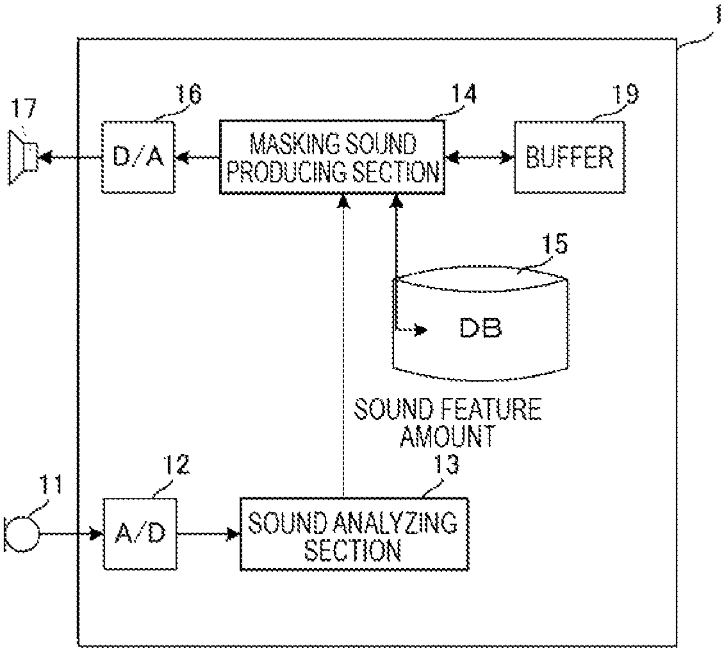
FIG. 4 is a block diagram showing the configuration of a sound processing apparatus of Modification 2.

FIG. 4 is a block diagram showing the configuration of a sound processing apparatus of Modification 2. Also in the figure, the components which are identical with those of the sound processing apparatus 1 shown in FIG. 1(A) are denoted by the same reference numerals, and their description is omitted.

The sound processing apparatus 1 of FIG. 4 includes a buffer 19. The buffer 19 corresponds to an analysis result storing section which stores the sound feature amount that is supplied from the sound analyzing section 13 to the masking sound producing section 14, for a predetermined time period. Similarly with the sound processing apparatus 1' shown in FIG. 1(B), the microphone 11 and the loudspeaker 17 may be integrated with the sound processing apparatus 1 of FIG. 4. Alternatively, only one of the microphone 11 and the loudspeaker 17 may be integrated with the sound processing apparatus 1 of FIG. 4.

The masking sound producing section 14 compares the latest sound feature amount which is supplied from the sound analyzing section 13, with the past sound feature amount stored in the buffer 19, and, if a different sound feature amount is calculated, stops the process of producing the output masking sound based on the latest sound feature amount, and produces the output masking sound based on the past sound feature amount stored in the buffer 19. In this case, even when voice uttered by a person other than the speaker 2 is suddenly input, the output masking sound is not largely changed (an erroneous sound feature amount is not reflected to the output masking sound), and therefore the masking effect can be stabilized.

In the case where the actual speaker is changed and a different sound feature amount is extracted, the sound feature amount of the new speaker remains to be extracted even after the predetermined time period has elapsed. Therefore, the sound feature amount stored in the buffer 19 is updated to that of the new speaker, so that the latest sound feature amount which is supplied from the sound analyzing section 13 again coincides with the past sound feature amount stored in the buffer 19. After an elapse of the predetermined sound time period, therefore, it is possible to produce an adequate masking sound.

Hereinafter, a summary of the invention will be described.

The sound processing apparatus of the invention includes: an inputting section to which a sound signal is input; an analyzing section which analyzes the input sound signal; a storing section which stores a general-purpose masking sound; a masking sound producing section; and an outputting section which outputs the output masking sound produced by the masking sound producing section.

The general-purpose masking sound is a general-purpose one which can be expected to exert a masking effect on voice of any kind of speaker at a certain degree. For example, the general-purpose masking sound is configured by sound data in which voices of a plurality of persons including men and women are recorded, and contains a disturbance sound having no lexical meaning (the content of a conversation cannot be understood). When the listener simultaneously hears such a disturbance sound and the voice of the speaker, the listener hardly understands the content of the utterance of the speaker. As compared with the case where the voice of the speaker oneself is processed and then output as a disturbance sound, however, the masking effect is lower.

Therefore, the masking sound producing section produces the output masking sound based on a result of the analysis by the analyzing section, and the general-purpose masking sound stored in the storing section. For example, the analyzing section extracts a sound feature amount (such as the pitch and the formants) of the speaker contained in the input sound signal, and, based on the extracted feature amount of the speaker, the masking sound producing section processes the general-purpose masking sound stored in the storing section to produce an output masking sound. Specifically, the pitch of the general-purpose masking sound stored in the storing section is converted to that of the input sound signal, or the formants of the general-purpose masking sound are converted to those of the input sound signal (for example, the center frequencies are made coincident, or the bandwidths are made coincident). As a result, a disturbance sound having a voice quality which approximates to the voice quality of the actual speaker is output from the outputting section, and therefore the masking effect becomes higher than that in the case of the general-purpose masking sound, so that the voice of the speaker can be adequately masked. The input voice of the speaker is used only in the analyzation, and the voice of the speaker does not undergo amplification or the like to be output. Since the output sound is not again picked up to be amplified (a loop system is not formed), it is possible to prevent howling from occurring.

In the case where the eliminating section which eliminates the output masking sound from the input sound signal is provided, even when the output masking sound which is once output is again picked up, it is possible to adequately analyze only the voice of the speaker.

Furthermore, the apparatus may further include the analysis result storing section which stores the analysis result for the predetermined time period, and the masking sound producing section may compare the result of the analysis by the analyzing section with the analysis result stored in the analysis result storing section, and, if a different analysis result is calculated, stop the production of the output masking sound which is based on the result of the analysis by the analyzing section.

In this case, even when a sound which is different from the voice of the speaker is suddenly input, the output masking sound is not largely changed (an erroneous analysis result is not reflected to the output masking sound), and therefore the masking effect can be stabilized.

The application is based on Japanese Patent Application (No. 2010-236019) filed on Oct. 21, 2010, and the contents of which are incorporated herein by reference.

INDUSTRIAL APPLICABILITY

According to the invention, it is possible to provide a sound processing apparatus and sound processing method which produce an adequate masking sound while preventing howling from occurring.

DESCRIPTION OF REFERENCE NUMERALS AND SIGNS

1 . . . sound processing apparatus
2 . . . speaker
3 . . . listener
11 . . . microphone
12 . . . A/D converting section
13 . . . sound analyzing section
14 . . . masking sound producing section
15 . . . database
17 . . . loudspeaker

The invention claimed is:

1. A sound processing apparatus comprising:
- an inputting section that inputs a sound signal;
- an analyzing section that analyzes the input sound signal;
- an analysis result storing section that stores the analysis result for a predetermined time period;
- a storing section that stores a general-purpose masking sound;
- a masking sound producing section that, based on a result of the analysis by the analyzing section, processes the general-purpose masking sound stored in the storing section to produce an output masking sound;
- an outputting section that outputs the output masking sound,
- wherein the masking sound producing section compares the result of the analysis by the analyzing section with the analysis result stored in the analysis result storing section, and when a different analysis result is calculated therebetween, stops the production of the output masking sound that is based on the result of the analysis by the analyzing section.

2. The sound processing apparatus according to claim 1, wherein:
- the analyzing section extracts a sound feature amount of the input sound signal; and
- the masking sound producing section processes the general-purpose masking sound stored in the storing section, based on the sound feature amount, to produce the output masking sound.

3. The sound processing apparatus according to claim 1, further comprising an eliminating section that eliminates the output masking sound from the input sound signal.

4. The sound processing apparatus according to claim 1, wherein the output masking sound includes a combination of a sound that is continuously generated and a sound that is intermittently generated.

5. A sound processing method in a sound processing apparatus having a storing section that stores a general-purpose masking sound and an analysis result storing section that stores the analysis result for a predetermined time period, the sound processing method comprising:
- an inputting step of inputting a sound signal;
- an analyzing step of analyzing the input sound signal;
- a masking sound producing step of, based on a result of the analysis by the analyzing step, processing the general-purpose masking sound stored in the storing section to produce an output masking sound; and
- an outputting step of outputting the output masking sound,
- wherein the masking sound producing step compares the result of the analysis in the analyzing step with the analysis result stored in the analysis result storing section, and when a different analysis result is calculated therebetween, and stops the production of the output masking sound that is based on the result of the analysis in the analyzing step.

6. The sound processing method according to claim 5, wherein:
- the analyzing step extracts a sound feature amount of the input sound signal, and the masking sound producing step processes the general-purpose masking sound stored in the storing section based on the extracted sound feature amount to produce the output masking sound.

7. The sound processing method according to claim 5, further comprising an eliminating step of eliminating the output masking sound from the input sound signal.

8. The sound processing method according to claim 5, wherein the output masking sound includes a combination of a sound that is continuously generated and a sound that is intermittently generated.

* * * * *